United States Patent [19]

Wen et al.

[11] Patent Number: 5,572,049

[45] Date of Patent: Nov. 5, 1996

[54] MULTI-LAYER COLLECTOR HETEROJUNCTION TRANSISTOR

[75] Inventors: Cheng P. Wen, Mission Viejo; Chan-Shin Wu; Cheng-Keng Pao, both of Torrance; David B. Rensch; William E. Stanchina, both of Thousand Oaks, all of Calif.

[73] Assignee: Hughes Aircraft Company, Los Angeles, Calif.

[21] Appl. No.: 422,110

[22] Filed: Apr. 14, 1995

[51] Int. Cl.$^6$ .................. H01L 31/0328; H01L 31/0336
[52] U.S. Cl. ............................................. 257/197; 257/198
[58] Field of Search ................................. 257/197, 198; 437/133, 909

[56] References Cited

U.S. PATENT DOCUMENTS 5,330,932  7/1994  Liu et al. ............................... 437/133

FOREIGN PATENT DOCUMENTS 63-48859   3/1988  Japan ................................... 257/198
2-280338  11/1990  Japan ................................... 257/197
3-291942  12/1991  Japan ................................... 257/197

Primary Examiner—Wael M. Fahmy
Attorney, Agent, or Firm—M. E. Lachman; M. W. Sales; W. K. Denson-Low

[57] ABSTRACT

A multi-layer collector heterojunction transistor (10) provides for high power, high efficiency transistor amplifier operation, especially in the RF (radio frequency) range of operation. A larger band gap first collector layer (12), approximately 15% of the active collector region (11) thickness, is provided at the base-collector junction (13). A smaller band gap second collector layer (14) forms the remainder of the active collector region (11). The multi-layer collector structure provides higher reverse bias breakdown voltage and higher carrier mobility during relevant portions of the output signal swing. A lower saturation voltage limit, or "knee" voltage, is provided at the operating points where linear operating regions transition to saturation operating regions as depicted in the output voltage-current (I–V) characteristic curves. The magnitude of the output signal swing of an amplifier may be increased, providing higher power amplification with greater power efficiency. The power supply voltage for the amplifier may be increased, providing for the use of a smaller, lighter power supply.

4 Claims, 3 Drawing Sheets

MULTI-LAYER COLLECTOR HETEROJUNCTION TRANSISTOR

BACKGROUND OF THE INVENTION

1. Field of the Invention

The present invention relates to electronic amplifiers, and more particularly, to higher efficiency heterojunction bipolar transistor amplifiers.

2. Description of Related Art

In the present era of expanding wireless communication, it is highly desirable to increase the efficiency of high power amplifier devices, especially in the radio frequency (RF) range of operation. Increased efficiency generally leads to improved amplifier reliability, as well as providing for the use of smaller amplifier devices and smaller, more portable power supplies. These features are preferred in developing products such as, for example, mobile transceivers for wireless communication, phased array radar systems, or satellites with reprogrammable antenna beam patterns.

Heterojunction bipolar transistor (HBT) devices are one type of amplifier commonly used in RF wireless communication. HBTs have been built in monolithic microwave integrated circuits to perform as RF amplifiers. Conventional HBTs usually have a structure employing a uniform, single layer collector region. Conventional HBT devices operate at relatively low efficiencies, that is, a relatively low portion of the power supplied to the amplifier is usefully delivered to the output signal, with the remaining portion of the total input power being dissipated as heat. Low efficiency HBTs use more power, are relatively unreliable, dissipate a greater portion of the input power as heat, are generally larger in size amplifiers and generally operate from and require larger power supplies.

Accordingly, a need exists for increasing the efficiency of high power amplifier devices, especially in the RF range of operation.

SUMMARY OF THE INVENTION

According to the principles of the present invention, in broad and general terms, there is provided a bipolar transistor having a reduced saturation voltage limit (knee voltage) and an increased reverse bias base-collector breakdown voltage limit, thereby facilitating a larger output signal swing in an amplifier producing a corresponding increase in the power efficiency of the amplifier. The increase in the breakdown voltage limit provides for a larger power supply voltage in the amplifier, allowing for the use of a smaller and lighter power supply. This provides for the design of more portable and compact communication devices as described above.

In one broad aspect an embodiment of the present invention provides a bipolar transistor comprising at least two layers of semiconductor material in a collector region; a base region; and an emitter region; said regions disposed in a semiconductor substrate.

In a more particular aspect the embodiment of the present invention provides for a multi-layer collector bipolar transistor, comprising a first collector region; a second collector region; a base region; and an emitter region; said base region being disposed between said first collector region and said emitter region; said first collector region being disposed between said second collector region and said base region; said first collector region comprising a material with a relatively large energy gap between a conduction band and a valence band therein, and also with a relatively low carrier mobility therein; said second collector region comprising a material having a relatively small energy gap between a conduction band and a valence band therein, and also having a relatively high carrier mobility therein; wherein a substantially lower saturation voltage and a relatively higher reverse breakdown voltage are achieved in said transistor, thereby increasing the collector efficiency associated with said transistor.

These and other features of the present invention will be apparent to those skilled in the art from the following detailed description, taken together with the accompanying drawings.

DETAILED DESCRIPTION OF THE INVENTION

Figure 1A:
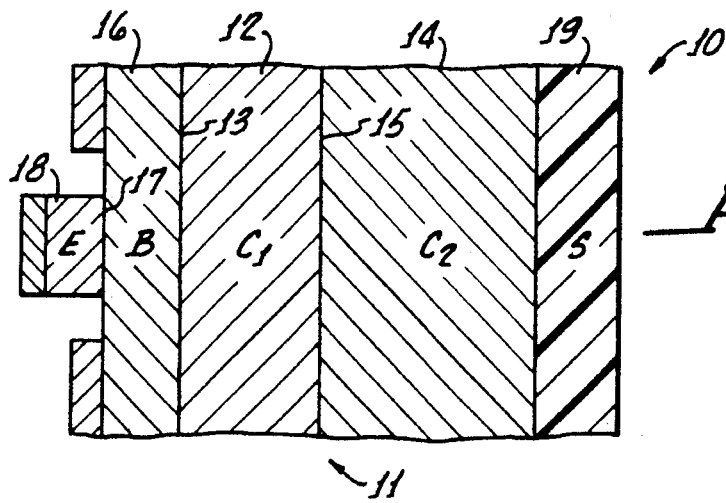
FIG. 1(a) illustrates the active regions of a multi-layer collector heterojunction bipolar transistor in accord with principles of the present invention.

As illustrated in FIG. 1(a), a multi-layer collector heterojunction bipolar transistor (HBT) 10, in accord with the principles of the present invention, provides for high power, high efficiency amplifier operation, especially in the RF (radio frequency) range of operation. FIG. 1 illustrates parts of a multi-layer collector HBT 10 which except for the use of a multi-layer collector region 11 and materials specifically chosen for particular semiconductor properties (e.g., energy band gap and/or carrier mobility), is made by processes conventionally employed for manufacturing HBT devices.

The multi-layer collector structure provides a device having higher reverse bias collector breakdown voltage at low collector currents and lower saturation voltage at high collector currents, thereby allowing for a greater magnitude output signal swing during amplifier operation. A higher magnitude output signal swing provides for greater amplification as well as greater power efficiency of the amplifier.

As illustrated in FIG. 1(a), a multi-layer collector bipolar transistor 10 in accord with the present invention preferably comprises at least two layers 12 and 14 in a collector region 11, a base region 16 and an emitter region 18, provided in a semiconductor substrate 19. The base-collector junction 13 comprises the surface where base region 16 makes contact with the first collector layer 12. The emitter-base junction 17 comprises the surface where base region 16 makes contact with emitter region 18. The collector layer junction 15 comprises the surface where the first collector layer 12 makes contact with the second collector layer 14.

Preferably, the semiconductor substrate 19, in which the base, collector, and emitter regions are formed, comprises gallium arsenide (GaAs) material. However, other suitable semiconductor substrate materials could be used, such as silicon (Si), germanium (Ge), other group (III–V) compounds, or group (II–VI) compounds. The multi-layer collector heterojunction transistor 10 is preferably fabricated using techniques, configurations, or materials that are commonly used in the fabrication of conventional bipolar junction transistors.

Figure 1B:
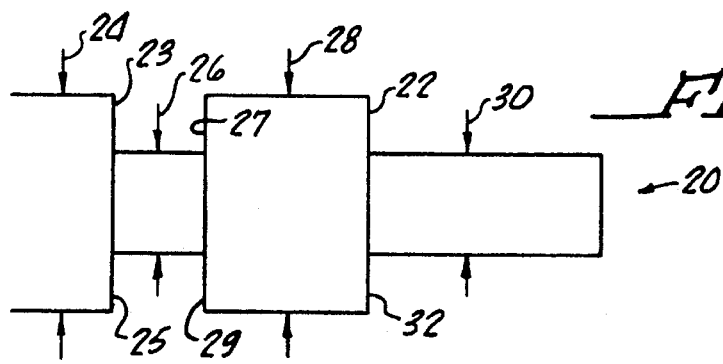
FIG. 1(b) is an energy band gap diagram illustrating typical energy band gap relationships for a multi-layer collector heterojunction bipolar transistor in accord with principles of the present invention.

The energy band diagram of FIG. 1(b) illustrates the relative energy band gap for each of the base region 16, the first collector layer 12, the second collector layer 14, and the emitter region 18, respectively. The band gap regions illustrated in FIG. 1(b) are in alignment with the corresponding base, collector, and emitter regions illustrated in FIG. 1(a). As illustrated in FIG. 1(a) and in the energy band gap diagram of FIG. 1(b), the present multi-layer collector HBT 10 preferably comprises an emitter region 18 comprising a material having a relatively large energy band gap 24; a base region 16, in contact with the emitter region 18, comprising a material having a relatively small energy band gap 26; a first collector layer 12, in contact with the base region 16, disposed in a collector region 11 and comprising a material having an energy band gap 28 of magnitude comparable to that of the emitter region energy band gap 24; and a second collector layer 14, in contact with the first collector layer 12, disposed in said collector region 11 and comprising a material having an energy band gap 30 comparable in magnitude to that of the base region energy band gap 26. The base region 16 is disposed between the emitter region 18 and the first collector region 12 and the first collector region 12 is disposed between the base region 16 and the second collector region 14.

First collector layer 12 has a thickness that preferably comprises 15% of the total active collector thickness and is disposed between and in direct contact with the base region 16 and the second collector layer 14. The second collector layer 14 has a thickness that preferably comprises the remainder of the active collector region thickness (e.g., 85%).

The first and second collector layers 12 and 14 are provided by doping appropriate regions of the semiconductor substrate 19 with impurity ions to form n-type material for an NPN transistor or to form p-type material for a PNP transistor. Similarly, appropriate regions of the substrate 19 are doped with impurity ions to provide either n-type or p-type material for the emitter and base regions, depending on the type of transistor being formed. Although the present multi-collector layer HBT 10 is illustrated with only two collector layers 12 and 14, principles of the present invention can be extended to provide a device with more than two layers.

As illustrated in FIG. 1(b), energy band gap diagram 20 exhibits conduction band discontinuity 22 and valence band discontinuity 32 at the collector layer junction 15 of the first collector layer 12 and the second collector layer 14. The energy band gap for each of the respective regions is illustrated in the diagram by the distance between the conduction band ($E_c$) and the valance band ($E_v$) of the material. The energy band gap is a unique property of the semiconductor material used to form the respective transistor regions. The energy band gap, in very general terms, is a factor governing the relative availability of charge carriers for conducting electricity within the respective semiconductor material at a given temperature, and is also a factor governing the operating electric field strength that can be applied across a given semiconductor region (or across the junction of two adjoining semiconductor regions).

The emitter 18 is preferably made from aluminum-gallium-arsenide ($Al_xGa_{1-x}As$) material, having a relatively wide (large) energy band gap 24. The base region 16 is preferably made from a material such as gallium arsenide (GaAs), having a relatively narrow (small) energy band gap 26. The first collector layer 12 is preferably made from an $Al_xGa_{1-x}As$ material having a relatively wide energy band gap 28. The second collector layer 14 preferably has a relatively narrow energy band gap 30 provided by the use of GaAs material for this layer. This arrangement gives rise to particular values of the (1) emitter-base conduction band discontinuity 23 and valence band discontinuity 25 at the emitter-base junction 17; (2) base-collector conduction band discontinuity 27 and valence band discontinuity 29 at the base-collector junction 13; and (3) collector layer conduction band discontinuity 22 and valence band discontinuity 32 at the collector layer junction 15.

In an alternative aspect embodying principles of the present invention, a gallium-indium-phosphorous/gallium-arsenide structure (GaInP/GaAs) (not shown) is alternatively provided at the base-collector junction 13 between the base region 16 and the first collector layer 12, thereby reducing the conduction band discontinuity 27 at said junction. In this alternative aspect, the emitter 18 and the first collector layer 12 are made from $Ga_xIn_{1-x}P$ semiconductor material rather than $Al_xGa_{1-x}As$ semiconductor material. In a $Ga_xIn_{1-x}P$ semiconductor compound, a fractional portion "x" (conventionally expressed as a decimal fraction) of the indium atom sites in the InP lattice structure are replaced with gallium atoms. A preferable value for the fractional portion "x" is approximately 0.5 (50% replacement).

In general terms a GaInP/GaAs junction exhibits a lower conduction band discontinuity and a higher valence band discontinuity than a corresponding AlGaAs/GaAs junction. Accordingly, this alternative aspect provides a relatively low value for (1) the emitter-base conduction band discontinuity 23; (2) the base-collector conduction band discontinuity 27; and (3) the collector layer conduction band discontinuity 22. This alternative aspect also provides a relatively high value for (1) the emitter-base valence band discontinuity 25; (2) the base-collector valence band discontinuity 29; and (3) the collector layer valence band discontinuity 32. This lowers the "knee" voltage because the electrons in the conduction band experience relatively low potential barrier at the base-collector junction 13 which has a lower conduction band discontinuity 27.

The energy band gap for GaAs, the material of both the base region 16 and the second collector layer 14, is 1.43 eV (electron-volts). In an $Al_xGa_{1-x}As$ semiconductor compound, a fractional portion "x" (conventionally expressed as a decimal fraction) of the gallium atom sites in the GaAs lattice structure are replaced with aluminum atoms. The introduction of aluminum in the lattice increases the magnitude of the energy band gap for an $Al_xGa_{1-x}As$ semiconductor compound as compared to the energy band gap of a GaAs semiconductor compound. The introduction of aluminum into the lattice also lowers the carrier mobility within the $Al_xGa_{1-x}As$ semiconductor compound as compared to the carrier mobility within the GaAs semiconductor compound. Thus the second collector layer 14, with its lower energy band gap, still has a relatively high carrier mobility which effectively maintains a relatively low series resistance and a relatively high current carrying capacity for the collector of the present HBT 10.

The present invention makes use of these semiconductor compound properties to advantageously increase the reverse bias collector breakdown voltage and to advantageously reduce the saturation voltage of the multi-layer collector HBT 10. The increased reverse bias collector breakdown voltage of the present multi-layer collector HBT 10 provides for the use of a smaller power supply having an increased voltage magnitude and a decreased maximum current rating. Both the increased reverse bias collector breakdown voltage and the reduced saturation voltage of the multi-layer collector HBT 10 provide for a larger magnitude signal swing of the output voltage in an amplifier design, thereby providing for greater power efficiency. The maximum current flowing in the amplifier output may therefore be decreased.

The operation and advantages of the present invention are explained with reference to FIGS. 2–4, and also with reference to FIG. 1(c). As illustrated in FIG. 2, the present multi-collector HBT 10 is preferably operated in the common-emitter amplifier configuration 34, which is well suited to RF power applications. Preferably this configuration is operated in the "Class A" mode to provide for linear power amplification. However, a multi-layer collector HBT 10 could also be operated in other configurations such as the common-collector or common-base configuration. Other classes of power amplifier designs (or modes of operation), such as class B, C, or D amplifiers, could also be implemented by one of ordinary skill in the art using the present invention based on the present disclosure.

The common-emitter circuit 34 is conventionally known and comprises a load 38 connected between a direct current (DC) power supply 40 ($V_{CC}$) and the collector lead "C" of multi-collector HBT 10; a reference node 46 (ground) connected to the emitter lead "E" of HBT 10; and a direct current biasing source 44 ($V_{BB}$) and an RF alternating current input signal source 42 ($V_{in}$) connected in series between the base lead "B" and the reference node 46. Although multi-collector HBT 10 is shown as an NPN transistor, one of ordinary skill in the art would easily comprehend the structure, operation, and advantages of a PNP multi-collector HBT 10 based on a reading of the present disclosure.

Class A amplifier design for the common-emitter circuit of FIG. 2 usually comprises the choice of values for (1) the resistance $R_L$ of the load 38; (2) the voltage magnitude $V_{CC}$ of the power supply 40; and (3) the voltage magnitude $V_{BB}$ of the DC bias source 44. The choice of values for $V_{CC}$ and $R_L$ define what is conventionally known as an output load line for the amplifier. FIG. 3 illustrates a load line 50 for a typical multi-layer collector HBT 10 in accord with the present invention and a load line 60 for a typical conventional HBT device.

The choice of values for $V_{CC}$ and $R_L$ are constrained by the output properties of the actual transistor used in the design of the amplifier circuit 34. The relevant output properties of a typical conventional HBT are illustrated in FIG. 3 as the current-voltage (I–V) output characteristic curves 62 and 64 (shown as broken lines). The relevant output properties of a typical multi-layer collector HBT 10 are illustrated in FIG. 3 as the I–V characteristic curves 54 and 56 (shown as solid lines).

The DC power supply 40 ($V_{CC}$) provides power to multi-layer collector HBT 10 for establishing a quiescent, or DC operating point "Q" of the transistor, and for amplifying the AC (e.g., RF) input signal $V_{in}$ presented to the base input "B" of the transistor. Amplification occurs because the multi-collector HBT 10 governs, or regulates the flow of a large collector current ($i_C$) in the load 38 in proportion to the changing AC input signal voltage $V_{in}$. The collector current $i_C$ induces a relatively large output voltage $V_{out}$ across the load resistor 38 in accord with Ohms' law. ($V_{out}=i_C \times R_L$). The instantaneous value of the output voltage $V_{out}$ and the collector current $i_c$ are proportionally related to each other based on the resistance value ($R_L$) of the load 38. Thus, a relatively small AC input signal voltage $V_{in}$ is amplified to a relatively large RF Voltage output signal $V_{out}$ using multicollector HBT 10 as an electronic valve for controlling the power delivered to load 38 from the power supply 40 ($V_{CC}$).

Figure 2:
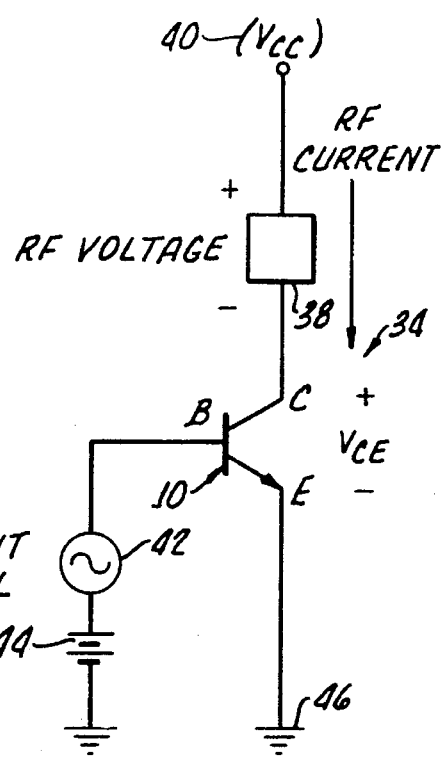
FIG. 2 is a schematic circuit diagram illustrating the use of a multi-layer collector heterojunction bipolar transistor, embodying principles of the present invention, as the active element in a conventional class A amplifier.
Figure 3:
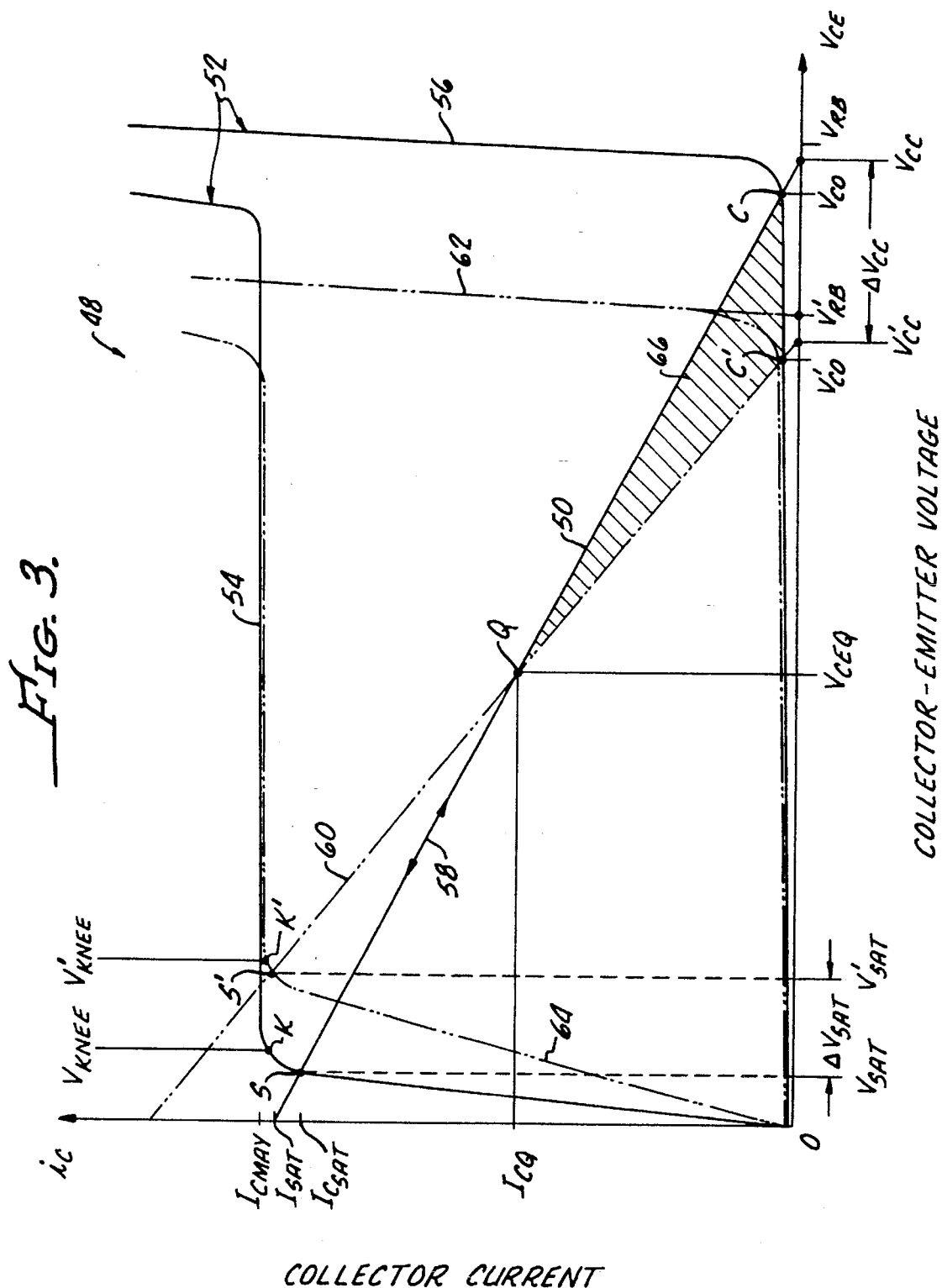
FIG. 3 is a graphical plot illustrating the output characteristic curves of a conventional heterojunction bipolar transistor and of a multi-layer collector heterojunction bipolar transistor of the present invention and also showing typical optimal load lines for the respective devices during class A amplifier operation.
Figure 4A:
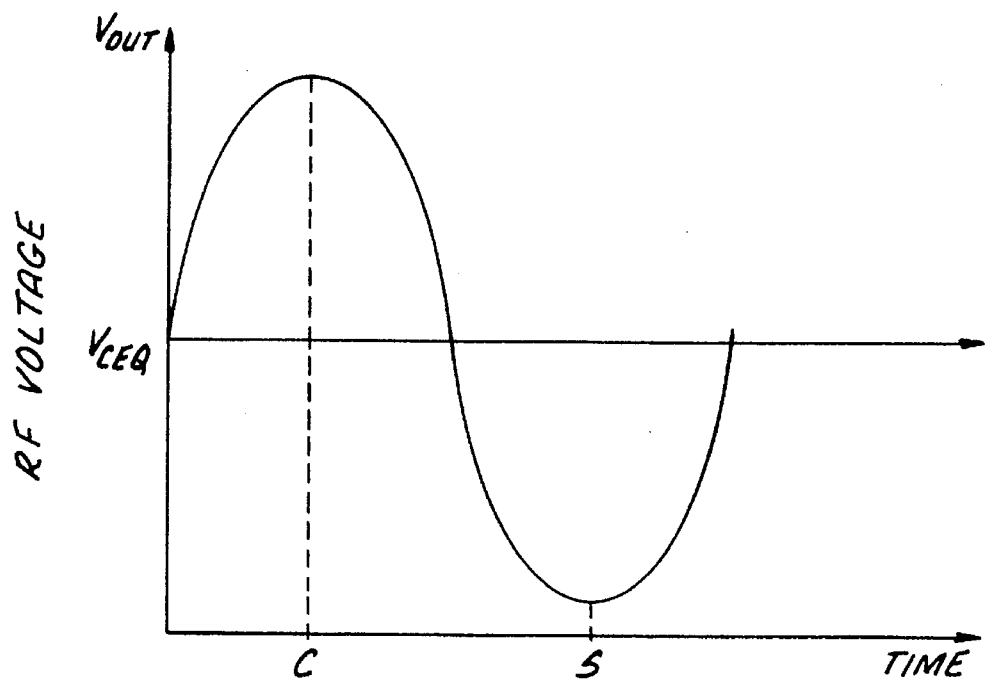
FIGS. 4a–4b is a timing diagram illustrating a typical RF output voltage and RF output current of a multi-layer collector heterojunction bipolar transistor during class A amplifier operation.
Figure 4B:
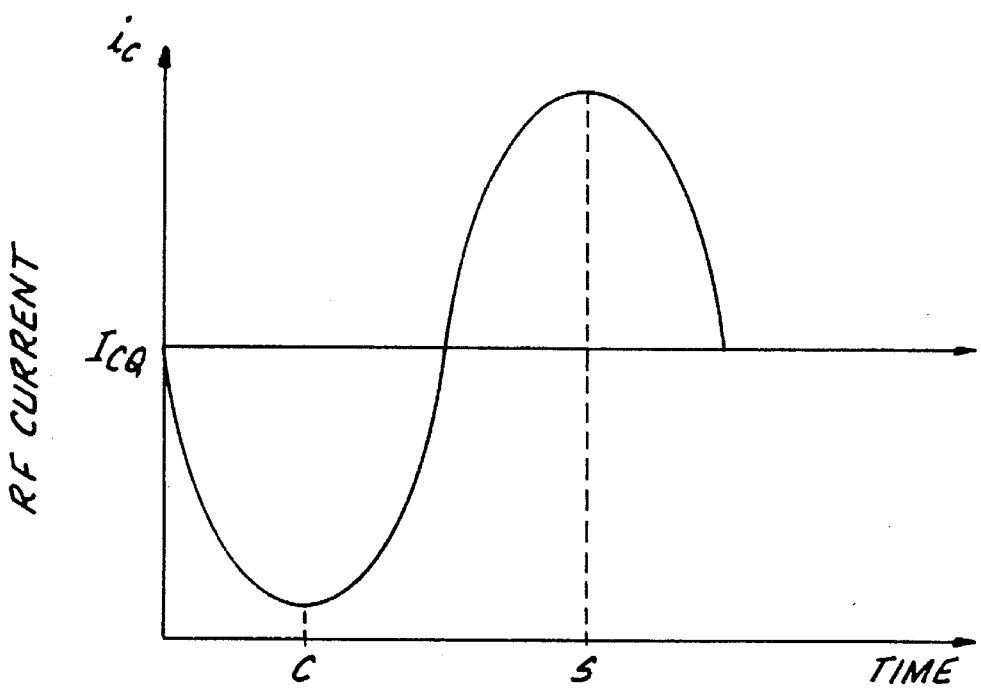

To further understand the operation and advantages of the present invention, a typical load line diagram 48 is illustrated in conventional fashion in FIG. 3. The load line 50 is drawn or superimposed on the output current-voltage (I–V) characteristic curves 52 of the multi-layer collector HBT 10. The slope of the load line 50 is inversely proportional to the resistance value $R_L$ of the load 38. The output characteristic curves 52 graphically represent a "family" of operating points for the multi-layer collector HBT 10 based on a wide range of possible input-output conditions for the transistor. Although only two curves 54 and 56 are shown in the figure, in actuality a continuous range of output operating points exists in the area bounded by these two curves. The load line 50 represents the parameters of the output circuit of FIG. 2 which are external to the transistor and which constrain the transistor operation to points on the load line 50. As indicated above, these parameters are the magnitude of the voltage $V_{CC}$ provided by the power supply 40 and the resistance value $R_L$ of the load 38.

The dynamic operating point 58 of the transistor is constrained to points on the load line 50 by the output circuit values $V_{CC}$ and $R_L$. The load line 50 contains three points of interest: (1) a quiescent point, or DC operating point "Q"; (2) a saturation point "S" occurring at the low collector bias portion of the RF cycle; and (3) a cutoff point "C" occurring at the high collector bias (reverse bias) portion of the RF cycle. For maximum signal amplification and efficiency, it is desirable to establish the quiescent point "Q" at the midpoint between the approximate saturation point "S" and the approximate cutoff point "C" of the load line 50. This provides for the maximum undistorted signal swing of the dynamic operating point 58 between approximate saturation point "S" and approximate cutoff point "C" of the transistor output (i.e., maximum linear amplification).

The quiescent point "Q" is conventionally established by biasing multi-layer HBT 10 in a conventional manner using a bias voltage represented by $V_{BB}$ in FIG. 2. Bias voltage $V_{BB}$ is conventionally derived from power supply $V_{CC}$ using a voltage divider circuit to fix the DC voltage at the base terminal "B" of the transistor.

The advantages of the present multi-layer collector HBT 10 are illustrated with reference to FIGS. 1(c), 3 and 4. The present multi-layer collector HBT 10 provides for an increased reverse bias collector breakdown voltage $V_{RB}$ as shown at the lower right of FIG. 3. The present multi-layer collector HBT 10 also provides for a reduced saturation voltage $V_{sat}$ as shown at the bottom left of FIG. 3. The reduced saturation voltage is possible because the present multi-layer collector HBT 10 has a relatively low "knee" voltage illustrated at point K when compared to the knee voltage of a conventional HBT as illustrated at point K' FIG. 4 shows timing diagrams illustrating a single cycle of the RF output voltage $v_{out}$ and the RF collector current $i_C$, corresponding to a single cycle of the RF input voltage $V_{in}$. The dashed lines in FIG. 4 illustrate the points in the output cycle which correspond to the cutoff point "C" and to the saturation point "S" shown in FIG. 3.

Figure 1C:
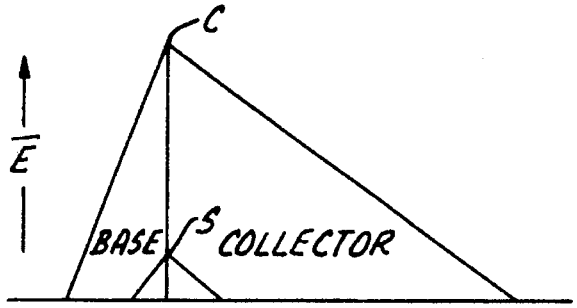
FIG. 1(c) is an electric field diagram illustrating typical electric field profiles in the base-collector regions of a multi-layer collector heterojunction bipolar transistor, embodying principles of the present invention, at relevant points during the operation of the transistor as a class A amplifier.

FIG. 1(c) illustrates the electric field profile in the base-collector region of the multi-layer collector HBT 10 at the occurrence of the cutoff point "C" and the saturation point "S". The peak electric field occurs at the base-collector junction 13 at the high collector bias portion of the RF cycle, where the transistor is operating at cutoff point "C". The large band gap of the first collector layer 12 provides for a higher breakdown voltage ($V_{RB}$) in the reverse biased base-collector junction 13. The multi-layer collector structure of the present HBT 10 provides it with an ability to maintain a higher peak value of the electric field before reverse breakdown occurs.

The minimum value of the electric field occurs at the low collector bias portion of the RF cycle, where the transistor is operating at saturation point "S". The high carrier mobility of the second collector layer 14 provides for a relatively large collector current to flow at a reduced saturation voltage $V_{sat}$ at low junction bias. The multi-layer collector structure of the present HBT 10 provides it with an ability to sustain a relatively high current with a relatively low saturation voltage $V_{sat}$.

More particularly, the cutoff point "C" for the present HBT 10 may be designed to be further to the right on the output I–V curves than for a conventional HBT having approximate cutoff point "C'". This is because the reverse breakdown voltage $V_{RB}$ indicated by characteristic curve 56 of the multi-layer collector HBT 10 is greater than the reverse breakdown voltage $V'_{RB}$ indicated by characteristic curve 62 of the conventional HBT. This allows the amplifier supply voltage $V_{CC}$ for use with the multi-layer collector HBT 10 to be of greater magnitude than would otherwise be appropriate for a conventional HBT.

Also, the saturation point "S" for the multi-layer HBT 10 is advantageously lower than the saturation voltage "S'" for the conventional HBT. This is possible since the "knee" voltage $V_{knee}$ (point "K") in characteristic curve 54 (where the saturation region transitions to the linear region) of the present HBT 10 is lower than (located further to the left in FIG. 3) the "knee" voltage $V'_{knee}$ (point "K'") of characteristic curve 64 of the conventional HBT.

For purposes of comparison, the conventional HBT and the multi-layer collector HBT 10 are assumed to operate at the same optimum quiescent point "Q", as shown in FIG. 3, based on the power limitations of the respective devices. This means that the two devices dissipate the same amount of DC power. However, the multi-layer collector HBT 10 provides for a larger output signal swing between points "S" and "C" than does the conventional HBT between points "S'" and "C'". This means that the multi-layer collector HBT 10 delivers more usable power to the load 38 in the form of the RF output signal, resulting in greater power efficiency.

The collector power efficiency ($n_c$) is the ratio of the RF power delivered to the load divided by the DC power input, and can be calculated by the following equation:

$$n_c = \frac{\text{MAX } RF \text{ POWER DELIVERED TO LOAD}}{DC \text{ POWER INPUT}}$$

$$n_c = \frac{\frac{1}{2}\left[\frac{1}{2}(V_{cc}-V_{knee})\left(\frac{1}{2}I_{max}\right)\right]}{\left[V_{knee}+\frac{1}{2}(V_{cc}-V_{knee})\right]\left(\frac{1}{2}I_{max}\right)}$$

$$n_c|_{V_{knee}=0} = 50\%$$

Thus it can be seen that reducing the saturation voltage limit "$V_{knee}$" for the transistor increases the efficiency of a class A power amplifier. In the theoretical limit, $V_{knee}$ is reduced to zero and the efficiency reaches fifty percent ($n_c=50\%$). Since the present multi-layer collector HBT 10 provides for a substantially reduced value of $V_{knee}$, it provides for a corresponding increase in the power efficiency of the amplifier.

Additionally, the multi-layer collector HBT 10 provides for an increase in the value of $V_{CC}$ (shown as $V_{CC}$ in FIG. 3) and a corresponding decrease in the value of the maximum collector current $i_{Csat}$ for the amplifier design. This means the power supply can be smaller, lighter, and more portable for an amplifier utilizing the multi-layer collector HBT 10 compared to an amplifier utilizing a conventional HBT.

It will be seen that there has been described a heterojunction bipolar transistor having both high breakdown voltage and reduced undepleted collector layer series resistance. The high breakdown voltage leads to a high voltage and low current mode of operation, which is highly desirable because of the reduced power supply requirement. The configuration also provides increased power density leading to a smaller device and easy impedance matching.

The series resistance of undepleted collector material of prior transistors, which would absorb RF power under large signal operating conditions, is significantly reduced by using high mobility material in the second collector layer, which has a thickness forming a major fraction of the total collector thickness. In addition, the high breakdown voltage characteristic afforded by the high energy band gap of the relatively small thickness first collector layer that adjoins the base enables use of higher collector bias voltage, thereby increasing efficiency of transistor amplifier operation. Reduction of collector undepleted layer (second collector layer) resistance also leads to reduced saturation voltage (lower knee voltage) for the transistor. Such low knee voltage is critical to high efficiency power transistor operation. Thus the described heterojunction bipolar transistor has improved base collector junction breakdown characteristics and operates with higher efficiency under large signal conditions.

The present disclosure is provided for purposes of illustrating the principles of the present invention, and not by way of limiting the invention to the particular details and embodiments herein discussed. Accordingly, it is intended that the invention be limited only by the following claims.

What is claimed is:

1. A transistor comprising:
   an emitter region comprising a material of a first conductivity type and having a relatively large energy band gap;
   a base region contacting said emitter region and comprising a material of a second conductivity type and having a relatively small energy band gap; and
   a collector region comprising
      a first collector layer contacting said base and comprising a material of said first conductivity type and having an energy band gap of relatively large magnitude compared to that of said base region and wherein the thickness of said first collector layer comprises approximately 15% of the thickness of said collector region; and a second collector layer contacting said first collector layer and comprising a material of said first conductivity type and having an energy band gap of relatively small magnitude compared to that of said first collector layer region;

said base region being disposed between said emitter region and said collector region.

2. The transistor of claim 1, wherein said first collector layer has a carrier mobility which is relatively lower than the carrier mobility within said second collector layer;

whereby said transistor has a higher reverse bias breakdown voltage for the base-collector junction at relatively low collector currents and a lower collector-emitter saturation voltage at relatively high collector current operation, thereby increasing the efficiency of the transistor for use in power amplification applications.

3. The transistor of claim 1, in which said emitter region comprises aluminum gallium arsenide material doped with impurity ions to comprise said first conductivity type;

said base region comprises gallium arsenide material doped with impurity ions to comprise said second conductivity type;

said first collector layer comprises aluminum gallium arsenide material doped with impurity ions to form said first conductivity type; and said second collector layer comprises gallium arsenide material doped with impurity ions to form said first conductivity type.

4. The transistor of claim 1, in which said emitter region comprises gallium indium phosphorous material doped with impurity ions to comprise a first conductivity type;

said base region comprises gallium arsenide material doped with impurity ions to comprise said second conductivity type;

said first collector layer comprises gallium indium phosphorous material doped with impurity ions to form said first conductivity type; and said second collector layer comprises gallium arsenide material doped with impurity ions to form said first conductivity type.

* * * * *